Figure 1:
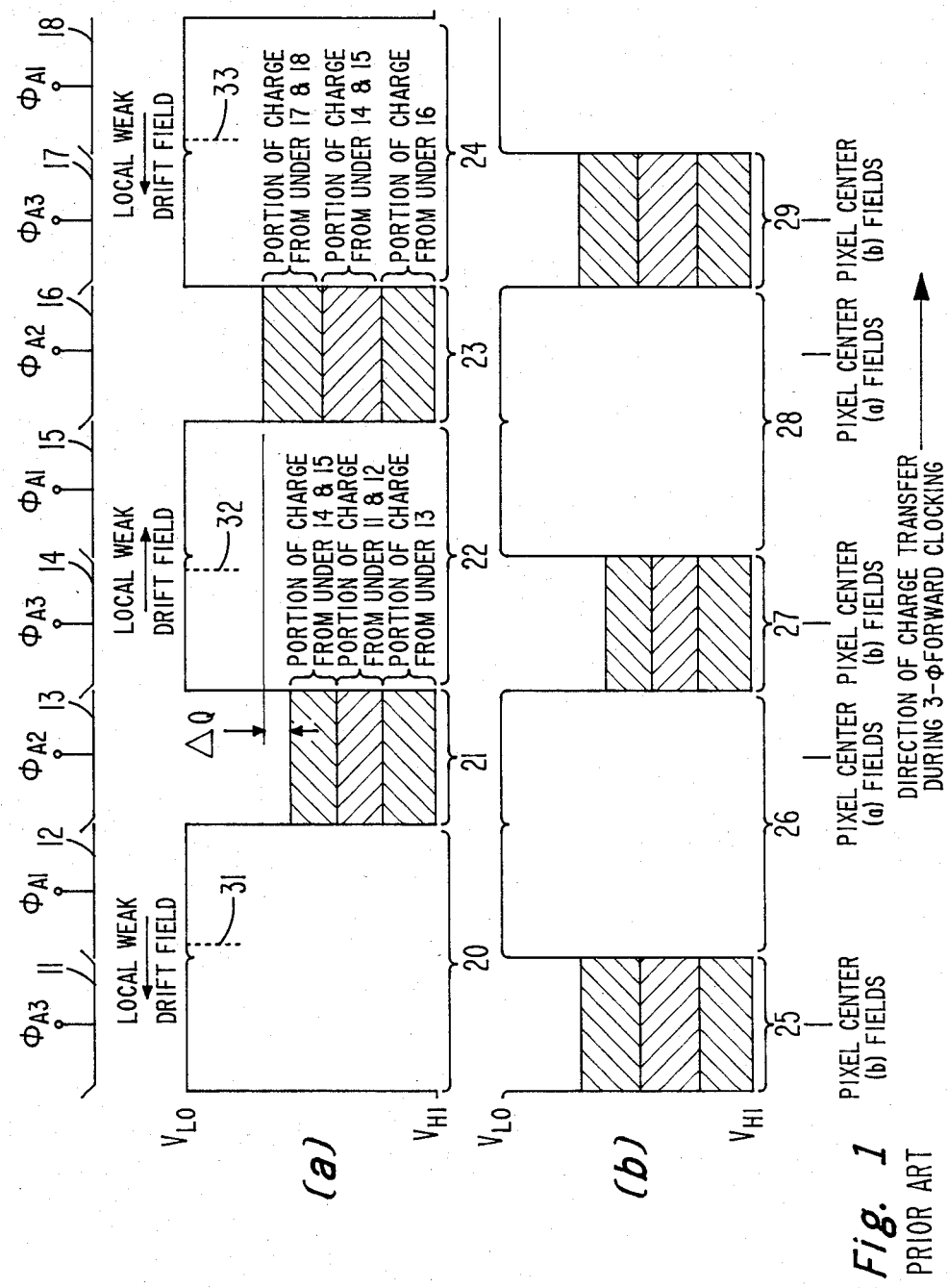

United States Patent [19]

Battson

[11] Patent Number: 4,507,684

[45] Date of Patent: Mar. 26, 1985

[54] REDUCING GRAIN IN MULTI-PHASE-CLOCKED CCD IMAGERS

[75] Inventor: Donald F. Battson, Landisville, Pa.

[73] Assignee: RCA Corporation, New York, N.Y.

[21] Appl. No.: 472,566

[22] Filed: Mar. 7, 1983

[51] Int. Cl.$^3$ ............................................... H04N 3/14
[52] U.S. Cl. .................................................... 358/213
[58] Field of Search ............................................ 358/213

[56] References Cited

U.S. PATENT DOCUMENTS 4,443,818  4/1984  Ohba et al. ........................... 358/213

FOREIGN PATENT DOCUMENTS

| 1524380 | 5/1977 | United Kingdom . |
| 1474514 | 9/1978 | United Kingdom . |
| 2069759A | 8/1981 | United Kingdom . |
| 2109630A | 6/1983 | United Kingdom . |

Primary Examiner—Richard Murray
Attorney, Agent, or Firm—Joseph S. Tripoli; George E. Haas; Allen LeRoy Limberg

[57] ABSTRACT

Grain, a fixed pattern noise which is not attributable just to dark current variations in the imager and which persists even in relatively bright images, is reduced in a CCD imager with three-phase-clocked imager register by introducing an offset potential between gate electrodes in the two clocking phases conventionally held at same potential during image integration times. In field transfer type CCD imagers, using field interlace and three-phase imager-register and field-store-register clocking, the offset potential can be made large enough, not only to reduce grain, but to improve field interlace from two-thirds field interlace towards or to perfect field interlace.

10 Claims, 5 Drawing Figures

REDUCING GRAIN IN MULTI-PHASE-CLOCKED CCD IMAGERS

The invention relates to the problem of grain in CCD imagers, especially in those of the type in which charge carriers generated by photo conversion are integrated in a CCD image register during halts in the multiphase clocking used for image transfer from that register.

Known in the art are CCD imagers of the field transfer type which use three-phase clocking of their image, or A, register and of their field storage, or B, register. Imagers of this type which have in their A registers gate electrodes of substantially equal lengths for all three clock phases can be operated without using field interlace. But imagers of this type are often operated using a form of interlace known as "two-thirds interlace".

In two-thirds interlace, image integration is caused to take place under the second-phase gate electrodes during alternate fields. This is done by holding these electrodes at relatively positive or "high" potentials to induce potential wells in which electrons generated by photo-conversion collect, while the first-phase and third-phase gate electrodes are held at relatively negative or "low" potential. (Voltages applied to the gate electrodes of imagers are referred to voltage, conventionally thought of as "ground potential", applied to the imager substrate.) In the intervening fields image integration takes place under the third-phase gate electrodes, held "high" to induce potential wells in which electrons generated by photo-conversion collect, while the first-phase and second-phase gate electrodes are held at relatively negative or "low" potential. Two-thirds interlace operation is characterized by imperfect interlace in the reconstructed television image, which may be unnoticed by the casual observer, but which evidences itself in stair-casing of diagonal edges.

A persistent problem encountered in CCD imagers using multiple-phase clocking voltages in their image registers is a type of fixed pattern noise which is not attributable just to dark current variations in the imager and which persists even in relatively bright images. This noise is commonly referred to as "grain" because its appearance in a reconstructed television image is similar to grain in images produced from fast photo-emulsion negatives in ordinary silver-halide photography. This grain effect is most pronounced in CCD imagers in which photo-conversion is carried out in certain of the CCD imager registers themselves or in their underlying substrate, but it can affect dark current variations in any type of CCD imager—even those using photodetector devices other than the CCD registers themselves or their underlying substrate. How "grain" comes about that appears in images produced from CCD imager output signals has not been understood.

The present inventor has discerned that "grain" in CCD imagers, the image registers of which are clocked in more than two phases, is the result of a type of partitioning noise that affects the electrons generated by photo-conversion in regions under the image register gate electrodes held low in potential during charge integration. With increase in the combined lengths of successive gate electrodes held low in potential in a multiple-phase image register, electrons generated in the regions between potential wells are less likely to be influenced by fringing fields from the potential wells induced under gate electrodes held high in potential. Consequently, these electrons are more likely to be affected by local electric field perturbations and so depart from ending up on average in the potential well closest to their generation site. This departure is perceived as grain structure in the image output. Grain increases rapidly as the combined lengths of successive gate electrodes held low becomes longer; this accords with the electrostatic force between an electron and a potential well being inversely related to the square of the distance between them. (In imagers the inventor has experimented with, grain increases rapidly as the combined lengths of successive gate electrodes held low is made longer than five microns.)

The present inventor has discovered that holding one of the gate electrode phases held at low potential in a three-phase CCD imager image register at a lower potential than the other reduces grain. In part this is because electrons generated below the less low gate electrodes generally fail to climb the potential barrier between adjacent low gate electrodes, so their collection by a particular one of the close-by potential wells is virtually certain. But also, the effective length of the gate electrodes held at lowest potential is shortened, to reduce the population of charge carriers that could be collected either by a leading or trailing potential well; and there is greater effect of fringing fields upon making it certain in which potential well the charge carriers are collected. Further, the present inventor has discovered that in a field transfer type of CCD imager where line interlace is used, at the same time grain is reduced, pixel center spacing in a frame can be made more uniform, to improve or perfect line interlace.

The present invention in one of its aspects is embodied in a method for operating CCD imagers with three-phase-clocked image, or A, registers. During each image integration time the first-phase gate electrodes are held low in potential, while one phase of the remaining second-phase and third-phase gate electrodes is held high in potential and the other is held low in potential. The novelty of the method is that the first-phase gate electrodes are held not so low in potential as the low-potential ones of the second-phase and third-phase gate electrodes. As the first-phase gate electrodes are made less low, grain is reduced up to a point. Thereafter, in a further aspect of the invention, supposing the three-phase image register to be operated with interlace, in which case second-phase and third-phase gate electrodes are alternated between being high and low in potential during successive fields of image integration, the method may be modified to hold the first-phase electrodes still less low in potential. This, to improve interlace from two-thirds interlace towards perfect interlace. Further aspects of the invention concern apparatus adapted for carrying forward the methods just outlined.

In the drawing, of which

FIGS. 1(a) and (b) and

Figure 2:
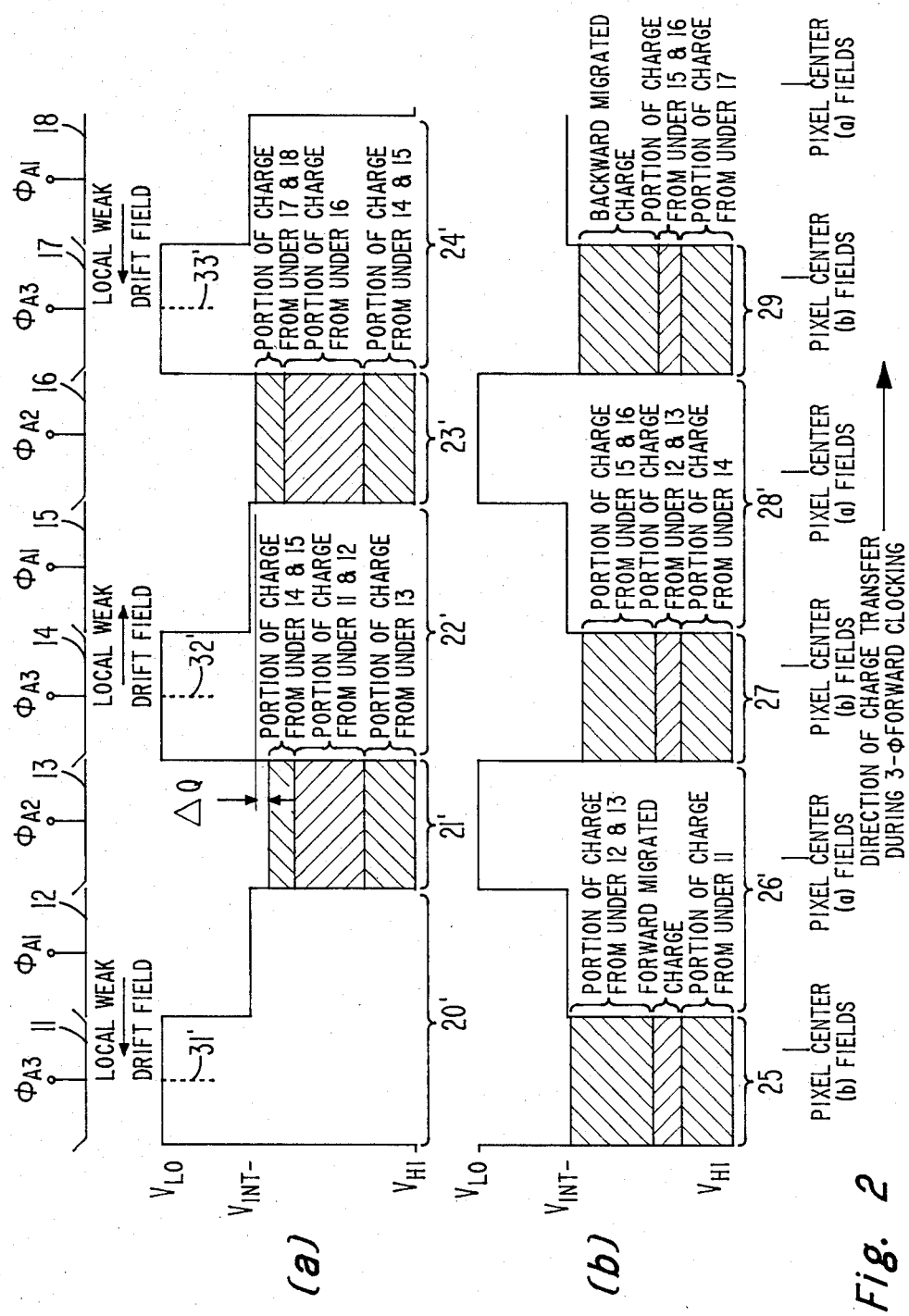
Figure 3:
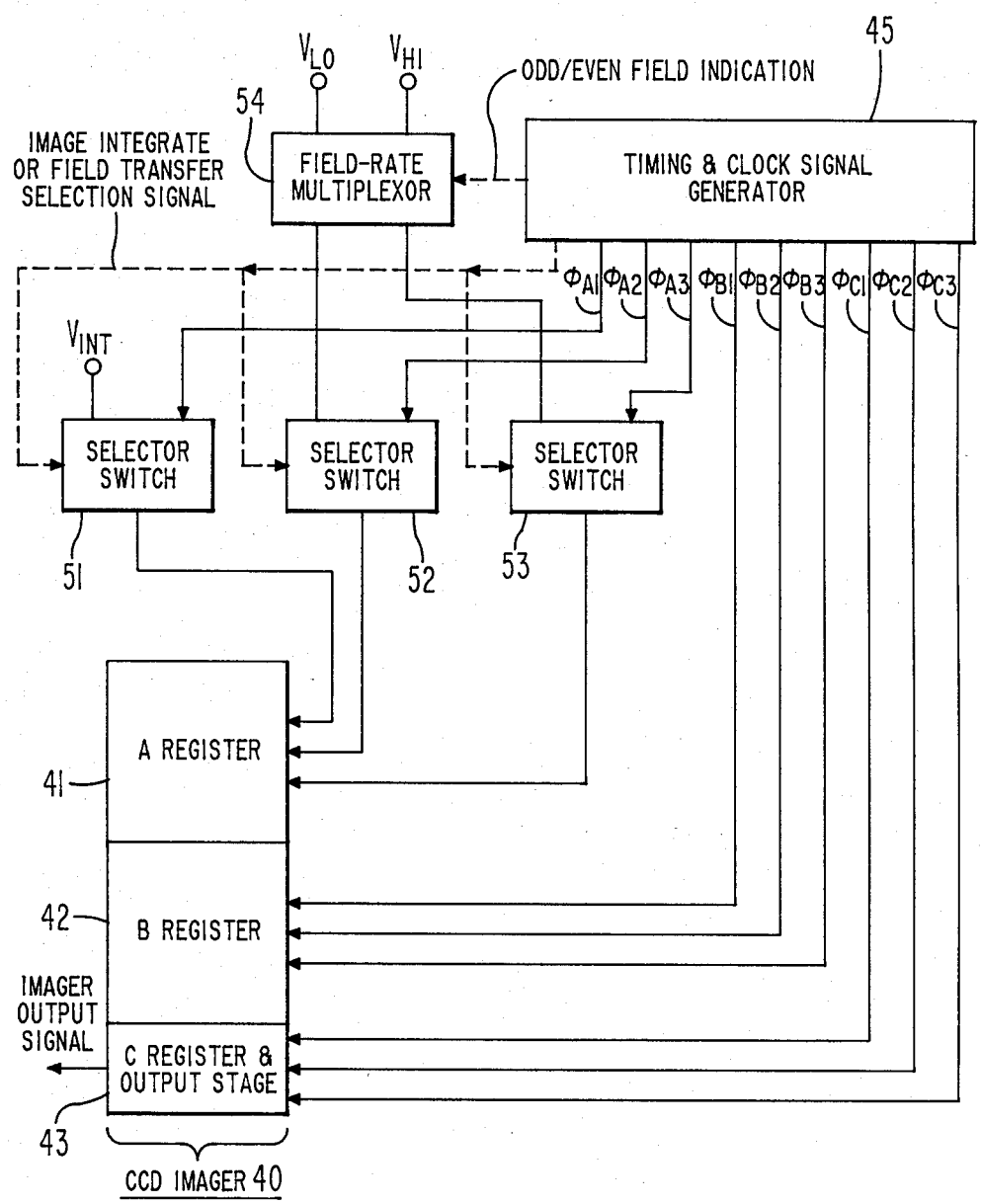

FIGS. 2(a) and (b) are potential profiles during image integration time along a portion of one channel of the three-phase-clocked image or A register of a CCD imager of field transfer type:

FIGS. 1a and b are potential profiles of the bias potentials applied to the image register gate electrodes during image integration times in first and second sets of alternate fields, respectively, in prior art practice where two-thirds interlace is used;

FIGS. 2(a) and (b) are potential profiles of the bias potentials applied to the image register gate electrodes during integration times in the first and second sets of alternate fields when the present invention is used to reduce grain and to improve field interlace; and FIG. 3 is a block schematic of representative apparatus for operating the CCD imager in accordance with FIG. 2 in practicing the invention.

FIGS. 1(a) and (b), like FIGS. 2(a) and (b), use the convention where more positive potentials are plotted below more negative ones. The relatively high voltage $V_{HI}$ applied to gate electrodes under which depletion regions are to be formed by electrostatic induction is positive respective to the relatively low voltage $V_{LO}$ applied to gate electrodes under which barrier potentials are to be allowed to exist; the resulting "wells" of potential in this form of diagram provide a graphic portrayal of the electric field configuration in which electrons are collected together. When "charge" is referred to, it is electron charge or negative conventional charge.

The gate electrodes 11–18 to which first-phase forward clocking voltage $\phi_{A1}$, second-phase forward clocking voltage $\phi_{A2}$, and third-phase forward clocking voltage $\phi_{A3}$ are cyclically applied during image transfer are shown at the top of FIG. 1. They provide positional references along the length of the charge transfer channel in the image register, against which references one may refer the positioning of the bias potentials under the gate electrodes during image integration times in the two sets of alternate fields. Forward clocking during image transfer is from left to right in all fields, since in the field interlace scheme being diagramed in CCD imager will be of the type that transfers all fields from the image register in the same direction, rather than in opposite directions on alternate field transfers.

In the first set of alternate fields as shown in FIG. 1(a) gate electrodes 11 and 12, receptive of $\phi_{A3}$ and $\phi_{A1}$ clocking during field transfer times, are held during image integration times at relatively low bias potential $V_{LO}$ to induce a potential barrier 20 beneath them. Gate electrode 13, receptive of $\phi_{A2}$ clocking during field transfer times, is held during image integration times at relatively high bias potential $V_{HI}$ to induce a potential well 21 thereunder. Gate electrodes 14 and 15, receptive of $\phi_{A3}$ and $\phi_{A1}$ clocking during field transfer times, are held at $V_{LO}$ during image integration times to induce a potential barrier 22 beneath them. Gate electrode 16 receptive of $\phi_{A2}$ clocking during field transfer times is held at $V_{HI}$ during image integration times, so a potential well is then induced under electrode 16. Gate electrodes 17 and 18 receptive of $\phi_{A3}$ and $\phi_{A1}$ clocking during field transfer times are held at $V_{LO}$ during image integration times to induce a potential barrier under those electrodes.

In the second set of alternate fields, interleaved in time with the first set, gate electrodes 11, 12, 13, 14, 15, 16, 17 and 18 are held at $V_{HI}$, $V_{LO}$, $V_{LO}$, $V_{HI}$, $V_{LO}$, $V_{LO}$, $V_{HI}$ and $V_{LO}$ respectively. Accordingly, potential wells are induced under electrodes 11, 14 and 17 which receive $\phi_{A3}$ clocking during field transfer times. The other gate electrodes, receptive of $\phi_{A1}$ and $\phi_{A2}$ clocking during field transfer times, have potential barriers under them during image integration times in the second set of alternate fields.

The mechanism by which grain arises will now be explained in detail with reference to FIG. 1a. The image register is presumed to be uniformly illuminated at constant brightness; and dark current effects will be assumed relatively negligible, to simplify explanation. As noted above, the present inventor believes that grain is developed during image integration owing to local electric field anomalies in portions of the charge transfer channel remote from the potential wells used as charge carrier collection sites. Weak local field anomalies may be caused by oxide thickness variations, surface contamination, non-uniform doping of the imager substrate or channel, or a variety of other imaginable causes. For the purposes of explanation suppose the local electric field anomalies are such that there happens to be a weak lateral drift field counter to forward charge transfer direction in the middle of the potential barrier under gate electrodes 11 and 12. This lateral drift field shifts ahead in the charge transfer channel the "continental divide" 31 for charge, at which plane through the charge transfer channel a charge carrier is equally likely to be collected in the potential well 21 as by the potential well immediately before potential barrier 20. The shift is towards well 21 from the middle of barrier 20 and reduces from one-half the portion of the charge carriers generated under gate electrodes 11 and 12 collected in potential well 21. Charge carriers generated under gate electrode 13 cannot escape the potential well 21 and are fully collected by it, of course; and the collection of charge carriers generated under a gate electrode held high is essentially unaffected by electric field anomalies.

Suppose further local field anomolies are such that there happens to be a weak lateral drift field parallel to forward charge transfer direction in the middle of barrier 22. This lateral drift field shifts back in the charge transfer channel the "continental divide" 32 for charge, at which plane a charge carrier is equally likely to be collected in the potential well 21 as in the potential well 23. This reduces from one-half the portion of the charge carriers generated under gate electrodes 14 and 15 that is collected in potential well 21, and at the same time it increases from one-half the portion of the charge carriers generated under gate electrodes 14 and 15 that are collected in potential well 23.

Suppose still further, local field anomalies are such that there happens to be a weak lateral drift field counter to forward charge transfer direction in the middle of the potential barrier under gate electrodes 17 and 18. This shifts "continental divide" 33 for charge ahead in the channel, increasing from one-half the portion of the charge carriers generated under gate electrodes 17 and 18 that is collected by potential well 23.

Weak local drift fields have, then, reduced in double measure the charge collected in potential well 21 and increased in double measure the charge collected in potential well 23 during the image integration time. Despite uniform field illumination of the image register, the amount of charge collected in potential well 23 exceeds by incremental charge $\Delta Q$ the amount of charge collected in potential well 21. Such variations in collected charge are in the aggregate responsible for a first of two portions of grain. The other portion is attributable to dark current being treated in similar fashion to the just-described treatment of charge carriers arising from photo-conversion in the image register.

Aside from slight shifts associated with the partitioning noise effects responsible for generating grain, it will be noted that each potential well collects all the charge carriers generated under the gate electrode inducing it and the statistical equivalents of the numbers of charge carriers generated under the preceding and succeeding gate electrode. This places pixel centers at, or reasonably close by to, the centers of the potential wells. That is, midway along the gate electrodes receiving $\phi_{A2}$ clocking in the first set of alternate fields, and midway along the gate electrodes receiving $\phi_{A3}$ clocking in the second set of alternate fields. This pattern of pixel center locations characteristic of two-thirds field interlace is shown along the bottom of FIG. 1.

FIG. 1a potential profile does not show the fringing field effects as between the higher potential $\phi_{A2}$ gate electrodes and their flanking lower-potential $\phi_{A1}$ and $\phi_{A3}$ gate electrodes. The fringing field effects are essentially symmetrical about the center of each $\phi_{A2}$ gate electrode, since its flanking $\phi_{A1}$ and $\phi_{A3}$ gate electrodes are at similar low potential, and so will not affect pixel center locations. FIG. 1b potential profile does not show the fringing field effects as between the higher potential $\phi_{A3}$ gate electrodes and their flanking lower potential $\phi_{A2}$ and $\phi_{A1}$ gate electrodes. The fringing field effects are essentially symmetrical about the center of each $\phi_{A3}$ gate electrode, since its flanking $\phi_{A2}$ and $\phi_{A1}$ gate electrodes are at similar low potential, and so will not affect pixel center locations.

FIGS. 2(a) and (b) show the potential profiles during image integration time in the first and second sets of alternate fields that result when, in accordance with the invention, the gate electrodes receiving $\phi_{A1}$ clocking signal during field transfer are biased not to $V_{LO}$, but to a potential $V_{INT}$ intermediate between $V_{LO}$ and $V_{HI}$. More particularly $V_{INT}$ is offset somewhat from $V_{LO}$ towards $V_{HI}$, to provide stepped potential barriers between the potential wells. The application of $V_{INT}$ to the $\phi_{A1}$ gate electrodes 12, 15, 18 in the first set of alternate fields (depicted by FIG. 2a) causes modified potential barriers 20', 22', 24' to have step reduction in the direction of forward charge transfer. This favors migration of charge carriers generated outside potential wells in the direction of forward charge transfer, towards the leading potential well rather than the trailing potential well. In the second set of alternate fields (depicted by FIG. 2b) application of $V_{INT}$ to electrodes 12, 15, 18 causes modified potential barriers 26', 28' to have step reduction in the direction counter to forward charge transfer. This favors migration of charge carriers generated outside the potential wells in the direction opposite to the direction of forward charge transfer, towards the trailing potential well rather than the leading potential well. That is, pixel centers are shifted forward in the first set of alternate fields and are shifted backward in the second set of alternate fields.

FIG. 2a does not show the fringing field effects, as between the lower potential $\phi_{A3}$ gate electrodes and their flanking higher-potential $\phi_{A2}$ and $\phi_{A1}$ gate electrodes, on the potential profile. If these fringing field effects were symmetrical about $\phi_{A3}$ gate electrode centers, one would expect the pixel edges to be at "continental divides" under the centers of $\phi_{A3}$ gate electrodes. This would place pixel centers under the abutting edges of $\phi_{A1}$ and $\phi_{A2}$ gate electrodes. The fringing field effect as between a low-potential $\phi_{A3}$ gate electrode and its flanking high-potential $\phi_{A2}$ gate electrode will be more pronounced than the fringing field effect as between the low-potential $\phi_{A3}$ gate electrode and its flanking intermediate-potential $\phi_{A1}$ gate electrode, which shifts the "continental divide" defining pixel edge towards the leading edge of the $\phi_{A3}$ gate electrode. A greater portion of the charge carriers originating in the region under the $\phi_{A3}$ gate electrodes are collected in the wells under the trailing $\phi_{A2}$ gate electrodes than would be the case without fringing field effects, and pixel centers are shifted forward towards the center of the $\phi_{A2}$ gate electrodes as indicated in FIG. 2a.

FIG. 2b does not show the fringing field effects, as between the low-potential $\phi_{A2}$ gate electrodes and their flanking higher-potential $\phi_{A1}$ and $\phi_{A3}$ gate electrodes, on the potential profile. As with FIG. 2a image integration, in FIG. 2b image integration the effects of these fringing fields are assymmetrical about the centers of the low-potential $\phi_{A2}$ gate electrodes. The fringing field effects between the low-potential $\phi_{A2}$ gate electrodes and the high-potential $\phi_{A3}$ gate electrodes are more pronounced than the fringing field effects between the $\phi_{A2}$ electrodes and the intermediate-potential $\phi_{A1}$ gate electrodes. The "continental divide" under each $\phi_{A2}$ gate electrode is shifted towards its trailing edge, so a greater portion of the charge carriers originating in the region under the $\phi_{A2}$ gate electrodes are collected in the wells under the leading $\phi_{A3}$ gate electrodes than would be the case without fringing field effects. Pixel centers are shifted backward towards the center of the $\phi_{A3}$ gate electrodes as indicated in FIG. 2b.

By controlling the level of $V_{INT}$ vis-á-vis $V_{LO}$ and $V_{HI}$ these fringing field phenomena can be used to improve field interlace from two-thirds field interlace, up to perfect interlace for any particular level of charge in the potential wells under the high-potential gate electrodes, for example—even beyond, towards the alternative two-thirds field interlace condition. In operation with 10 V-deep potential wells, a 3 V-to-4 V offset of $V_{INT}$ from $V_{LO}$ has been observed to result in essentially perfect interlace in 6-7-7 CCD imagers, the three-phase-clocked image registers of which use 6$\mu$-long first-phase gate electrodes and 7$\mu$-long second and third-phase gate electrodes.

Consider now how the application of $V_{INT}$ to the $\phi_{A1}$ gate electrodes during image integration times reduces grain, making reference to FIG. 2a. The potential steps in barriers 20', 22', 24' impede charge carrier migration from under $\phi_{A1}$ gate electrodes 12, 15 and 18 in the direction counter to conventional charge transfer. So, on a statistical basis one may assume these charge carriers to be completely collected by their leading potential wells 21, 23 and at right, off drawing. One needs, then, primarily only to concern himself with the statistics of how charge carriers generated under the $\phi_{A3}$ gate electrodes 11, 14 and 17 are partitioned in their migration between their respective trailing and leading potential wells. This reduction in the number of charge carriers really subject to partitioning noise at least halves $\Delta Q$, or grain, at the outset of our consideration, supposing the gate electrodes to be of uniform length.

Thusfar our assumptions with regard to charge carrier partioning in the image register have really all been made on the basis of long gate lengths, to emphasize the effects of the weak local fields that generate grain. The "continental divides" for charge 31', 32' and 33' are now ideally located at midlength of the $\phi_{A3}$ gate electrodes 11, 14 and 17 respectively. Their shift from the ideal locations owing to the effects of weak local lateral drift fields is reduced, compared to the case where $\phi_{A1}$ gate electrodes are held at $V_{LO}$ together with $\phi_{A2}$ or $\phi_{A3}$ gate electrodes, because their distances from a potential step is halved. This quadruples the force exerted by the potential well or step in the region of a "continental divide" for charge, vis-á-vis the weak force exerted by local electric field anomalies. So the total distance at $V_{LO}$ potential is halved; the drift effects of the local field anomalies compared to fringing of potential wells or steps is quartered; and thus the shifts of continental divides 31', 32', 33' for charge may be expected to on average be about an eighth of the shifts of "continental divides" 31, 32, 33 for charge in FIG. 1(a). Coupling this reduction of partitioning noise with the reduction of grain by one half directly owing to the potential barriers being stepped, as discussed in the previous paragraph, would result in a reduction of grain by a factor of about sixteen times.

In practice, when 10 V-deep potential wells are used for charge integration in a 6-7-7 CCD imager, visible grain disappears with the $\phi_{A1}$ gate electrodes offset by one to three volts from $V_{LO}$.

FIG. 3 shows representative circuitry for operating, in accordance with the invention, a CCD imager 40 with a three-phase-clocked image (or A) register 41, with a field store (or B) register 42 and with a parallel-to-serial converter (or C) register 43 including output stage. A conventional timing and clock signal generator 45 is used. During image integration intervals, which take place during field scanning times in the imager output signal, charge carriers generated in the semiconductive substrate of A register 41 are integrated under $\phi_{A2}$ gate electrodes in a first set of alternate fields and under $\phi_{A3}$ gate electrodes in the interleaved second set of alternate fields. After each image integration time, during field retrace time in the imager output signal, a field transfer interval occurs. In the field transfer interval selector switches 51, 52 and 53 are conditioned by a selection signal from generator 45 to apply $\phi_{A1}$, $\phi_{A2}$, $\phi_{A3}$ clocking signals to image register 41. These $\phi_{A1}$, $\phi_{A2}$, and $\phi_{A3}$ clocking signals are synchronous with the $\phi_{B1}$, $\phi_{B2}$ and $\phi_{B3}$ clocking signals, respectively, applied by clocking signals to B register 42. The field of image samples in A register 41 is transferred to B register 42 at a rapid enough rate that field transfer intervals takes place within field retrace time, and the C register of 43 shown as a three-phase-register receives $\phi_{C1}$, $\phi_{C2}$ and $\phi_{C3}$ clocking signals at still higher rate to clear remnant charge from B register 42.

After field transfer, a new image integration interval that occupies the time for field scan takes place. The $\phi_{B1}$, $\phi_{B2}$, $\phi_{B3}$ clocking signals are slowed to advance by one row or line the pixel charge samples in B register 42 each line retrace time, the row clocked out of B register 42 being parallelly entered into C register of 43, the clocking of which is halted. Each line trace interval, the clocking of the C register of 43 is resumed, to provide serial output from the output stage of 43 at pixel scan rate.

During this new image integration interval indication of whether the field is odd or even is supplied from timing and clock signal generator 45 to a multiplexor 54 as control signal for determining whether $V_{HI}$ and $V_{LO}$ or, alternatively, $V_{LO}$ and $V_{HI}$ are to be respectively supplied to selector switches 52 and 53 to be selected for respective application to $\phi_{A2}$ gate electrodes and to $\phi_{A3}$ gate electrodes. Selection by selector switches 52 and 53 of these voltages rather than $\phi_{A2}$ and $\phi_{A3}$ for application to certain A register 41 gate electrodes is made responsive to the selection signal from generator 45 indicating the A register is to operate in image integration rather than field transfer mode. Responsive to this same selection signal selector switch 51 selects against applying $\phi_{A1}$ to certain gate electrodes of A register 41. Instead it selects, not $V_{LO}$, as in the prior art, but $V_{INT}$, in accordance with the invention, for application to these gate electrodes.

One skilled in the art will recognize that there are certain straightforward variants of the method and apparatus just described, and this should be borne in mind in construing the claims that follow. The potential offset between the $\phi_{A1}$ gate electrodes and the ones of the $\phi_{A2}$ and $\phi_{A3}$ gate electrodes held low during image integration can be introduced by differentially doping the semiconductor (or possibly the insulating layer) under the $\phi_{A1}$ gate electrodes and that under the $\phi_{A2}$ and $\phi_{A3}$ gate electrodes. This form of the invention is less preferable in that it introduces some difficulty in generating $\phi_{A1}$, $\phi_{A2}$ and $\phi_{A3}$ clocking voltages, since the $\phi_{A1}$ clocking voltages must then be offset from the $\phi_{A2}$ and $\phi_{A3}$ clocking voltages during field transfer times.

What is claimed is:

1. A method for biasing during at least selected image integration times the gate electrodes in a CCD imager register to reduce the grain in the CCD imager output signal, said register being of the type with gate electrodes arranged in successive cycles of a first-phase gate electrode followed by a second-phase-gate electrode followed by a third-phase gate electrode, clocked three-phase during image transfer times, said method comprising the steps of during those at least selected image integration times:

applying first bias potential to said second-phase electrodes and applying second bias potential to said third-phase electrodes, one of said first and second bias potentials being of a value for inducing charge carrier collection sites close by the gate electrodes to which it is applied, for collecting charge carriers generated in said register, and the other of said first and second bias potentials being of a value not to induce charge carrier collection sites; and applying to said first-phase electrodes a third bias potential intermediate between said first and second bias potentials, sufficiently offset from said other of said first and second bias potentials to substantially reduce the grain in the CCD imager output signal.

2. Apparatus for carrying out the method of claim 1 comprising in addition to said CCD imager:

means for applying said first bias potential to said second-phase electrodes of said CCD imager register during said selected image integration times;

means for applying said second bias potential to said third-phase electrodes of said CCD imager register during said selected image integration times; and means for applying said third bias potential to said first-phase electrodes of said CCD imager register during said selected image integration times.

3. A method for biasing the gate electrodes in the image register of a CCD imager of field transfer type during field integration times, which image register is of the type clocked three-phase during field transfer times, said method comprising the steps of:

during field integration times in alternate fields biasing the second-phase gate electrodes with a relatively high bias potential and the third-phase gate electrodes with a relatively low bias potential;

during field integration times in the intervening fields biasing the third-phase gate electrodes with a relatively high bias potential and the second-phase gate electrodes with a relatively low bias potential; and during all field integration times biasing the first-phase gate electrodes with an intermediate bias potential between the relatively high and low bias potentials, said intermediate bias being more than relatively low in at least such degree as to reduce grain to be appreciably close to its minimum.

4. Apparatus for carrying out the method of claim 3 comprising, in addition to said CCD imager of field transfer type, the following:

means for applying said relatively high potential bias to said second-phase gate electrodes of said image register during image integration times in a first set of alternate fields and to said third-phase gate electrodes of said image register during image integration times in a second set of alternate fields interleaved in time with said first set of alternate fields;

means for applying said relatively low bias potential to said third-phase gate electrodes of said image register during image integration times in said first set of alternate fields and to said second-phase gate electrodes of said image register during image integration times in said second set of alternate fields; and means for applying said intermediate bias potential to said first-phase gate electrodes during image integration times in both said first and said second sets of alternate fields.

5. A method as set forth in claim 3 wherein the intermediate bias potential applied to said first-phase gate electrodes during all field integration times is more than low in such degree as to substantially improve field interlace.

6. Apparatus for carrying out the method of claim 5 comprising, in addition to said CCD imager of field transfer type, the following:

means for applying said relatively high potential bias to said second-phase gate electrodes of said image register during image integration times in a first set of alternate fields and to said third-phase gate electrodes of said image register during image integration times in a second set of alternate fields interleaved in time with said first set of alternate fields;

means for applying said relatively low bias potential to said third-phase gate electrodes of said image register during image integration times in said first set of alternate fields and to said second-phase gate electrodes of said image register during image integration times in said second set of alternate fields; and means for applying said intermediate bias potential to said first-phase gate electrodes during image integration times in both said first and said second sets of alternate fields.

7. A method as set forth in claim 3 wherein the intermediate biasing potential applied to said first-phase gate electrodes during all field integration times is more than low in such degree as to afford substantially perfect field interlace.

8. Apparatus for carrying out the method of claim 7 comprising, in addition to said CCD imager of field transfer type, the following:

means for applying said relatively high potential bias to said second-phase gate electrodes of said image register during image integration times in a first set of alternate fields and to said third-phase gate electrodes of said image register during image integration times in a second set of alternate fields interleaved in time with said first set of alternate fields;

means for applying said relatively low bias potential to said third-phase gate electrodes of said image register during image integration times in said first set of alternate fields and to said second-phase gate electrodes of said image register during image integration times in said second set of alternate fields; and means for applying said intermediate bias potential to said first-phase gate electrodes during image integration times in both said first and said second sets of alternate fields.

9. A method for reducing grain in the output of a CCD imager of the type having an image register to which three-phase clocking signals are applied during times of field transfer, said method comprising during each image integration time between successive field transfer times performing the steps of:

applying to every third gate electrode a bias voltage for inducing proximate to that electrode a potential well for collecting charge carriers; and applying to each intervening pair of gate electrodes respective bias voltages for causing a stepped potential barrier, with one step being proximate to one gate electrode of the pair and the other step proximate to the other gate electrode of the pair.

10. A method as set forth in claim 9, for reducing grain in the output of a CCD imager, wherein said step of applying to each intervening pair of gate electrodes respective bias voltages for causing a stepped potential barrier is carried forward in a first set of alternate fields for causing said stepped potential barriers to step up in the direction of normal charge transfer;

wherein said step of applying to each intervening pair of gate electrodes respective bias potentials for causing a stepped potential barrier is carried forward in a second set of alternate fields, interleaved in time with the first set of alternate fields, for causing said stepped potential barriers to step down in the direction of normal charge transfer; and wherein the magnitudes of the steps up and steps down in said stepped potential barriers is adjusted for providing appreciably improved interlacing.

* * * * *